United States Patent
Yamashita (10) Patent No.: US 8,436,451 B2
(45) Date of Patent: May 7, 2013

(54) SEMICONDUCTOR DEVICE AND METHOD OF MANUFACTURING A SEMICONDUCTOR DEVICE

(75) Inventor: Hiroshi Yamashita, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/036,490

(22) Filed: Feb. 28, 2011

(65) Prior Publication Data

US 2011/0210434 A1 Sep. 1, 2011

(30) Foreign Application Priority Data

Feb. 26, 2010 (JP) .................................. 2010-041608

(51) Int. Cl.
*H01L 23/495* (2006.01)

(52) U.S. Cl.
USPC ........... 257/676; 257/666; 257/690; 257/692; 257/693; 438/123

(58) Field of Classification Search .................. 257/676, 257/666, 690, 692–693, E23.031, E21.499; 438/123

See application file for complete search history.

(56) References Cited

U.S. PATENT DOCUMENTS

| | | | | |
|---|---|---|---|---|
| 5,430,250 A * | 7/1995 | Kwon | ............................. | 174/535 |
| 5,877,548 A | 3/1999 | Washida et al. | | |
| 6,713,322 B2 * | 3/2004 | Lee | ............................. | 438/123 |

FOREIGN PATENT DOCUMENTS

| | | |
|---|---|---|
| JP | 4-363055 | 12/1992 |
| JP | 6-224353 | 8/1994 |
| JP | 11-214606 | 8/1999 |
| JP | 2001-77278 | 3/2001 |
| JP | 2004-328015 | 11/2004 |

OTHER PUBLICATIONS

Japanese Office Action dated Feb. 5, 2013 in corresponding Japanese Patent Application No. 2010-041608 with English translation of enclosed portions of Japanese Office Action.

* cited by examiner

*Primary Examiner* — Theresa T Doan
(74) *Attorney, Agent, or Firm* — Young & Thompson

(57) ABSTRACT

An apparatus provides good bonding between a package structure and a substrate and extended solder bonding life, even under heat stress. Of a lead frame to be used for a package structure having a configuration in which a semiconductor chip, an island of the lead frame, and external connection terminals are sealed with a resin from one surface, and the island and the external connection terminals are exposed on the other surface, the external connection terminals include a first external connection terminal disposed at a central part of each of sides of an outer rim of a semiconductor chip mounting region in which the semiconductor chip is to be mounted and a second external connection terminal outside the first external connection terminal at each of the sides of the outer rim of the semiconductor chip mounting region, wherein the first external connection terminal area exceeds the second external connection terminal's.

3 Claims, 8 Drawing Sheets

5mm32pin

FIG. 8B

8mm56pin

SEMICONDUCTOR DEVICE AND METHOD OF MANUFACTURING A SEMICONDUCTOR DEVICE

This application is based on Japanese Patent Application No. 2010-041608, the content of which is incorporated hereinto by reference.

BACKGROUND

1. Technical Field

Embodiments described herein relate generally to a semiconductor device and a method for producing the same, particularly, to a semiconductor device including a package structure and a method of manufacturing a semiconductor device.

2. Related Art

In a semiconductor device having a package structure in which a semiconductor chip is mounted on an island (also called die pad) of a lead frame and sealed with a sealing resin, it has heretofore been recognized that a large stress is applied at a corner part of the package structure. Therefore, technologies for preventing peeling of a lead which is an external connection terminal at the corner part receiving the large stress have been studied.

For example, Japanese Patent Application Laid-Open No. 2004-328015 and No. H11-214606 disclose a configuration in which an alignment pitch of the external connection terminals is reduced at a central part of a side and increased at a corner part. It is described that the configuration prevents peeling of the lead and the like at the corner part receiving the large stress and leads to high density of a semiconductor device by increasing the number of external connection terminals at the central part while enhancing reliability.

Japanese Patent Application Laid-Open No. H10-012790 discloses a configuration in which a bonding part for bonding to a bonding electrode of a mounting substrate and a dummy terminal having a width wider than a lead are provided at each of opposed sides of the lead provided on a lateral surface of a package structure.

Japanese Patent Application Laid-Open No. H06-224353 discloses that strength of a predetermined number of external connection terminals located at an end part is increased to be higher than that of medially-located external connection terminals, and a an area of the predetermined number of external connection terminals located at the end part for bonding to a substrate is increased to be larger than that of medially-located external connection terminals, so that bending of the external connection terminals at the end part is prevented or the medially-located external connection terminals are protected by the external connection terminals at the end part. It is described that the configuration improves connection reliability between the electronic components and the substrate by increasing the bonding strength.

Japanese Patent Application Laid-Open No. H04-363055 discloses a configuration in which a width of a lead is gradually reduced from a central part to an end part so as to reduce rigidity of the lead at the end part of a package structure as compared to the lead at the central part of each of sides of the package structure.

SUMMARY

In the case of a leadless package such as QFN (Quad Flat Non-leaded Package), in general, an island is exposed from a package structure and soldered onto a mounting substrate together with external connection terminals. Since it is possible to allow heating from a semiconductor chip to escape (discharge) to the mounting substrate side by soldering the island exposed from the package structure, an effect of reducing thermal resistance of the package structure is attained.

The inventor had found that a stress is increased at a central part than at a corner part of the package structure in which the island is also soldered. The inventor used QFNs having the structure in which an island is exposed from the package structure and conducted a temperature cycle test by applying a heat stress on the QFNs in order to investigate a bonding state between external connection terminals and a mounting substrate in the cases of:

(a) bonding to the mounting substrate by soldering the external connection terminals and without soldering the island; and (b) bonding to the mounting substrate by soldering both of the external connection terminals and the island.

The QFNs used in the temperature cycle test were those having an outside dimension of 5 mm×5 mm and 32 pins (8 pins/side), an outside dimension of 7 mm×7 mm and 48 pins (12 pins/side), and an outside dimension of 8 mm×8 mm and 56 pins (14 pins/side) (each of which is Ni/Pd/Au-plated). The temperature cycle test was conducted under the conditions of −40° C. to +125° C. Each of the QFNs was soldered daisy chain connection on the mounting substrate, and a resistance value between the resistance measurement terminals at opposite ends of the daisy chain was monitored during the temperature cycle test to determine the number of cycles at which the resistance value was increased by 20% from the initial resistance value as a solder bonding failure. The QFN determined to have the solder bonding failure was taken out from the temperature cycle test vessel, and an appearance and a section of the solder bonding part were observed.

As a result, in the case of (a) in which the island was not soldered, the bonding failure occurred at about 4000 cycles. As a result of the section observation, a crack was found at the solder bonding part of the external connection terminal at a corner part (end part) of the package structure, and, therefore, it was confirmed that the heat stress is larger at the corner part (end part) of the package structure as it had been recognized in the conventional technology.

Figure 7:
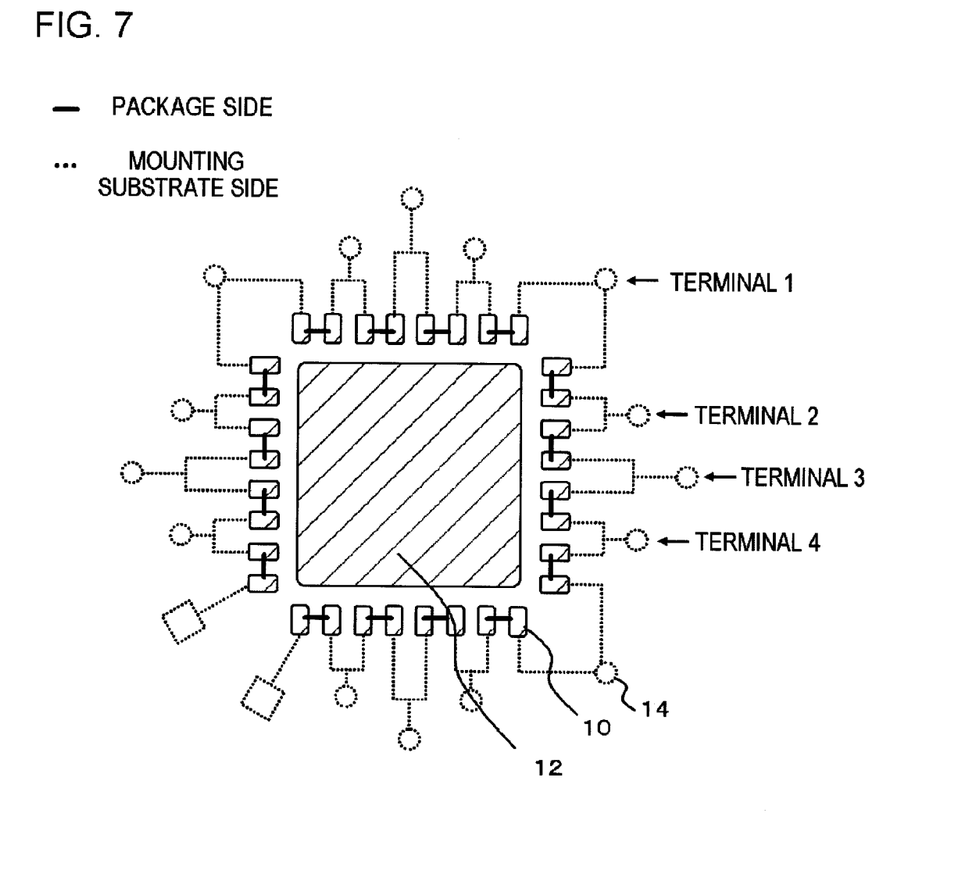
FIG. 7 is a plan view showing a state of daisy chain connection of a QFN having an outside dimension of 5 mm×5 mm and 32 pins (8 pins/side)

In turn, in the case of (b) in which the island was soldered, the bonding failure occurred at about 6000 cycles. The resistance value was increased at a central part of each of sides resulting in a higher occurrence frequency of solder bonding failure as compared to a corner part (end part) of the package structure. FIG. 7 is a plan view showing a state of the daisy chain connection of the QFN having the outside dimension of 5 mm×5 mm and 32 pins (8 pins/side). In FIG. 7, the external connection terminals 10, the island 12, and the terminals 14 for measuring the resistance value are shown. In the QFN having the size of 5 mm×5 mm and 32 pins, resistance values at 4 points per side were measured. Likewise, resistance values at 6 points per side were measured in the QFN having the size of 7 mm×7 mm and 48 pins, and resistance values at 7 points per side were measured in the QFN having the size of 8 mm×8 mm and 56 pins.

Figure 8A:
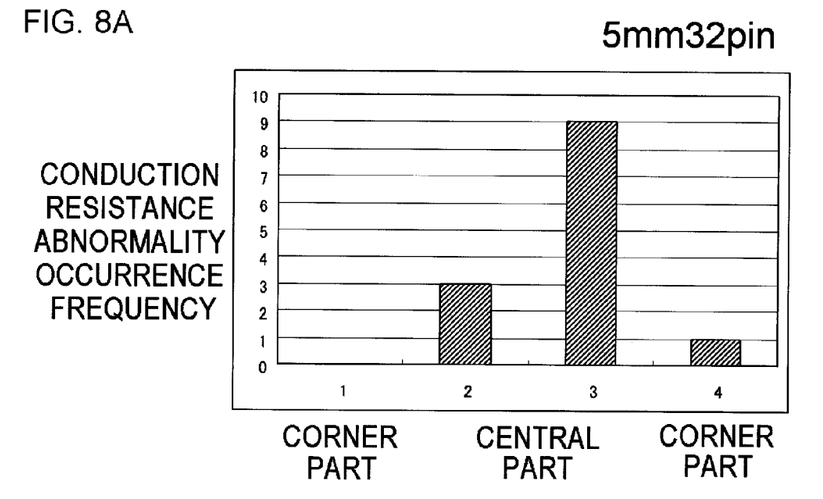
FIGS. 8A and 8B are diagrams showing a relationship between measurement points and conduction resistance abnormality occurrence frequencies in the case where bonding to a mounting substrate is conducted by soldering external connection terminals and an island.
Figure 8B:
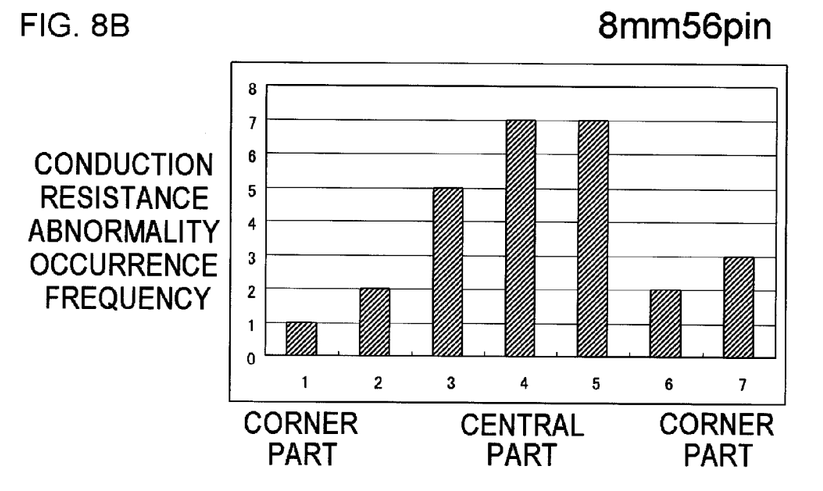

Shown in FIGS. 8A and 8B are relationships between the measurement points and conduction resistance abnormality occurrence frequencies in the QFN of 5 mm×5 mm and 32 pins (5 mm-32 pin) and the QFN of 7 mm×7 mm and 48 pins (8 mm-56 pin). In both of the cases of 5 mm-32 pin (FIG. 8A) and 8 mm-56 pin (FIG. 8B), the conduction resistance abnormality occurrence frequency was higher at the central part of each of the sides as compared to that at the corner part (end part) of the package structure. Also, the same results were obtained in the QFN having the size of 7 mm×7 mm and 48 pins.

As a result of the section observation, a larger number of cracks was confirmed at the solder bonding part of the external connection terminals at the central parts of the sides (two or one of two external connection terminals at both sides of a centerline of the package structure) than at the corner parts (end parts) of the package structure to find that the heat stress applied on the solder bonding part is larger at the central parts of the sides than at the corner parts.

In the case where the heat stress is applied to the package structure as described above, the stress applied to the external connection terminal is subject to influence by a difference between linear expansion coefficients of the package structure and the mounting substrate. Since only the external connection terminals are fixed in the case where the island is not soldered, it is possible to assume a distortion at the center of the package structure to be 0. Thus, the stress is increased at the external connection terminals at the corner parts which are distant from the center of the package structure as compared to the external connection terminals at the central part of each of the sides.

In contrast, in the case where the island is soldered, since a bonding area of the island is remarkably larger than a bonding area of the terminal connection terminal, bonding strength of the island is remarkably high, and it is possible to consider distortion of the island as a whole is 0. In this case, a distance between the corner part (end part) and the island and a distance between the central part of each of the sides and the island of the package structure are identical to each other. However, since the external connection terminal at the corner part of the contacting sides exists in the package structure, the stress is remarkably reduced at the corner part as compared to the central part, and the stress applied to the central part is relatively increased.

Therefore, in the semiconductor device having the configuration that the island is exposed from the package structure and solder-bonded to the mounting substrate, a problem of a reduction in bonding reliability of the external connection terminals at the central parts of the sides where the stress is large is raised in the configurations disclosed in the conventional technologies.

In one embodiment, there is provided a semiconductor device including a semiconductor chip, an island in which the semiconductor chip is mounted on one surface, a plurality of external connection terminals disposed around the semiconductor chip along an outer rim of the semiconductor chip with a gap being defined from the island, and a resin that seals the semiconductor chip, the island, and the plurality of external connection terminals from the one surface and exposes the island and the plurality of external connection terminals on other surface, wherein the plurality of external connection terminals include a first external connection terminal disposed at a central part of each of sides of the outer rim of the semiconductor chip and a second external connection terminal disposed at each of the sides of the outer rim of the semiconductor chip and outside the first external connection terminal, and the first external connection terminal has an area larger than that of the second external connection terminal.

In another embodiment, there is provided a method of manufacturing a semiconductor device including bonding a package structure including a semiconductor chip, an island in which the semiconductor chip is mounted on one surface, a plurality of external connection terminals disposed around the semiconductor chip along an outer rim of the semiconductor chip with a gap being defined from the island, and a sealing resin that seals the semiconductor chip, the island, and the plurality of external connection terminals from the one surface and exposes the island and the plurality of external connection terminals on other surface in such a manner that the other surface of the island is opposed to one surface of the substrate by bonding each of the island and the plurality of external connection terminals to a substrate via a solder, wherein the plurality of external connection terminals include a first external connection terminal disposed at a central part of each of sides of the outer rim of the semiconductor chip and a second external connection terminal disposed at each of the sides of the outer rim of the semiconductor chip and outside the first external connection terminal, and the first external connection terminal has an area larger than that of the second external connection terminal.

According to the above-described configuration, the external connection terminals and the island are exposed at the reverse side of the package structure. Therefore, it is possible to attain good bonding by increasing a bonding area between the package structure and the substrate by bonding the island in addition to the external connection terminals to the substrate such as the mounting substrate via a solder. In such semiconductor device, according to the findings of the inventor, a crack is easily caused at the central parts of the sides since the heat stress is increased at the central parts to be larger than that at the corner parts. However, according to the configuration of the present invention, since the area of the first external connection terminal is wide, it is possible to widen the bonding area between the first external connection terminal and the substrate at the central part of each of the sides, thereby being capable of extending a solder bonding life even in the case where the heat stress is applied.

Arbitrary combinations of the above-described constituent elements and embodiments attained by exchanging the expressions of the present invention between a method and a device and the like are effective as modes of embodiments of the present invention.

According to the present invention, it is possible to attain good bonding between the package structure and the substrate as well as to extend a solder bonding life even in the case where a heat stress is applied.

BRIEF DESCRIPTION OF THE DRAWINGS

The above and other objects, advantages, and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, one embodiment of the present invention will be described with reference to the accompanying drawings. In all of the drawings, same constituent features are denoted by an identical reference numeral, and a description thereof will not be repeated.

Figure 1:
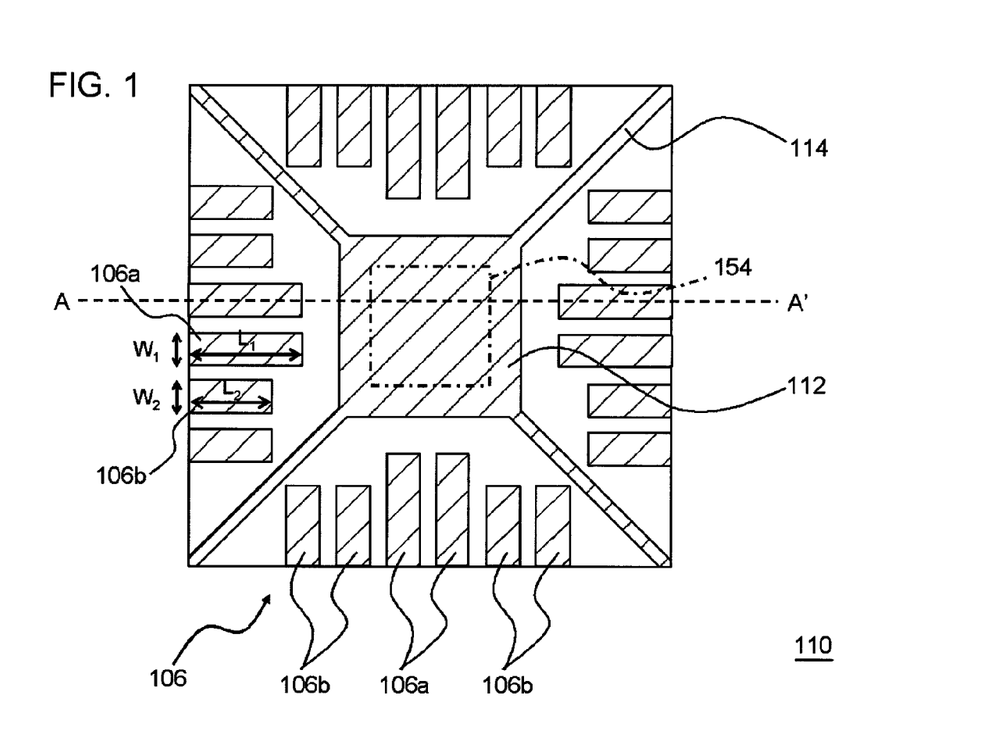
FIG. 1 is a plan view showing one example of a configuration of a part of a lead frame according to one embodiment of the present invention.

FIG. 1 is a plan view showing a configuration of a part of a lead frame 110 according to the present embodiment. In the lead frame 110, a plurality of structures (each of which is a package structure shown in FIG. 1) are disposed in matrix.

The lead frame 110 includes an island 112 on which a semiconductor chip is mounted; a plurality of external connection terminals 106 disposed around the island 112 along sides of an outer rim of the island with a gap being defined from the island 112; a hanging lead 114 extending in a direction of a diagonal line of the island 112 from a corner part of the island 112; and an outer frame (not shown) connecting the hanging lead 114 to the plurality of external connection terminals 106. In FIG. 1, a semiconductor chip mounting region 154 indicated by a broken line is a region on which the semiconductor chip is to be mounted later on.

In the present embodiment, the plurality of external connection terminals 106 include a first external connection terminal 106a disposed at a central part of each of the sides of the outer rim of the semiconductor chip mounting region 154 and a second external connection terminal 106b disposed at each of opposite ends of each of the sides of the outer rim of the semiconductor chip mounting region 154 and outside the first external connection terminal 106a. The first external connection terminal 106a has an area for bonding to the substrate which is larger than that of the second external connection terminal 106b.

In the present embodiment, when the first external connection terminal 106a has a width $W_1$, a length $L_1$, and an area $D_1$, and the second external connection terminal 106b has a width $W_2$ a length $L_2$, and an area $D_2$, the width $W_1$ and the width $W_2$ are equal to each other, but the length $L_1$ is longer than the length $L_2$. Therefore, the area $D_1$ of the first external connection terminal 106a is larger than the area $D_2$ of the second external connection terminal 106b.

The lead frame 110 having the above-described configuration can easily be produced only by changing a pattern during the production. In the case where there are 8 external connection terminals 106 on each of the sides, the first external connection terminal 106a, which is large, may be used for about 2 to 4 terminals at the central part. In the case where a distance between the external connection terminals at the opposite ends of one side is 100, the central part means a range of about 30 to 60, more preferably 25 to 50. With such configuration, it is possible to extend a solder bonding life against a heat stress since the heat stress tends to be applied on the region of the above-specified range.

Figure 2A:
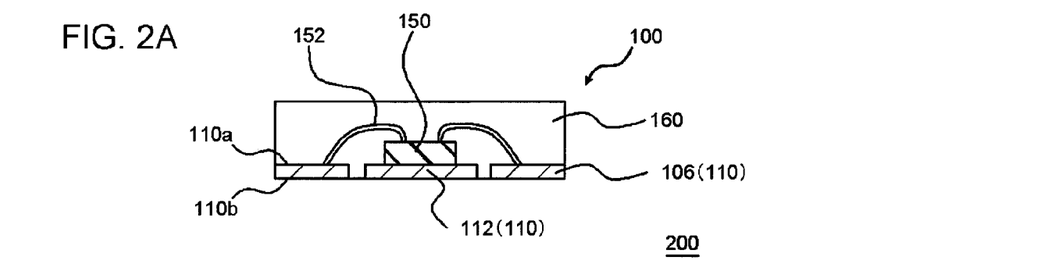
FIGS. 2A and 2B are sectional views showing process steps of a process for producing a semiconductor device according to the embodiment of the present invention.
Figure 2B:
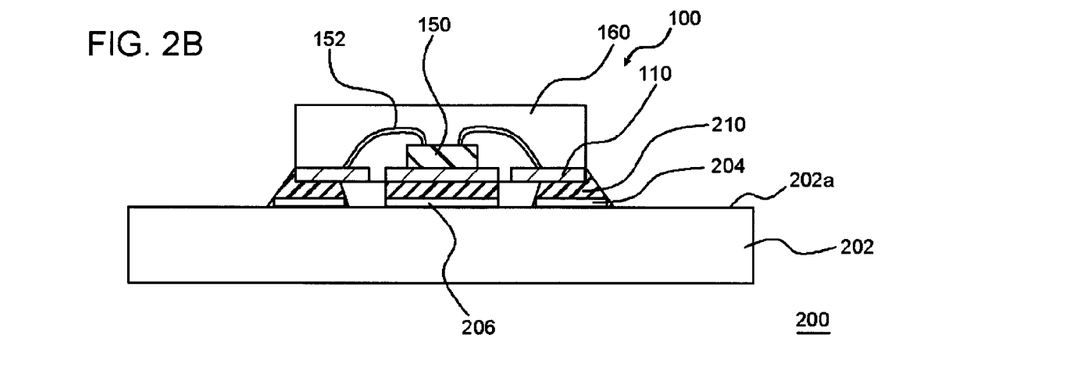

FIGS. 2A and 2B are sectional views showing process steps of a process for producing a semiconductor device 200 according to the embodiment of the present invention. Each of FIGS. 2A and 2B is a sectional view taken along a line A-A' of FIG. 1.

A semiconductor chip 150 is mounted on the semiconductor chip mounting region 154 of the island 112 on one surface 110a of the lead frame 110 of the configuration shown in FIG. 1. Thus, the plurality of external connection terminals 106 are disposed around the semiconductor chip 150 along sides of an outer rim of the semiconductor chip 150.

Though not shown in the drawings, terminals such as a plurality of bonding pads are formed on a top surface of the semiconductor chip 150. Subsequently, the external connection terminals 106 of the lead frame 110 corresponding to the terminals of the semiconductor chip 150 are connected via a bonding wire 152.

Next, the semiconductor chip 150 is embedded from the surface 110a of the lead frame 110 with a sealing resin 160. The sealing resin 160 may seal the semiconductor chip 150, the island 112, and the external connection terminals 106 from the surface 110a of the lead frame 110 and may leave the island 112 and the plurality of external connection terminals 106 to be exposed on the other surface 110b. After that, the lead frame 110 sealed with the sealing resin 160 is cut (dicing) along an outer frame (not shown) connecting the hanging lead 114 to the external connection terminals 106 for separation into package structures 100. Thus, a semiconductor device 200 having the package structure 100 having the configuration shown in FIG. 2A is obtained.

Figure 3:
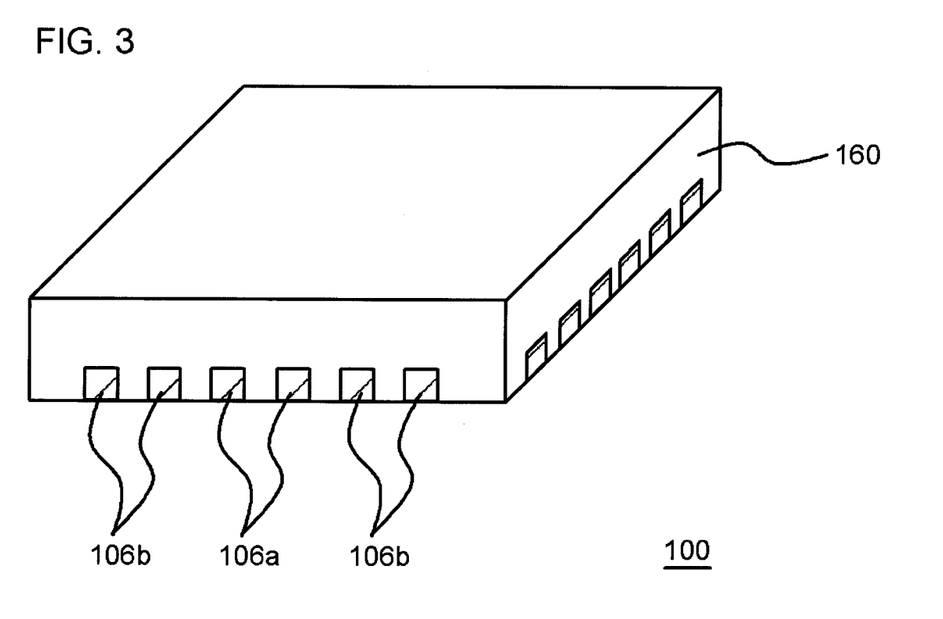
FIG. 3 is a perspective view showing a package structure according to the embodiment of the present invention.

FIG. 3 is a perspective view showing the package structure 100 according to the present embodiment. In the present embodiment, the package structure 100 may be a leadless package in which the lead is not projected from a lateral surface of the sealing resin 160. The package structure 100 may be QFN.

Referring back to FIGS. 2A and 2B, the package structure 100 is mounted on a substrate 202 to be bonded to the substrate 202. The substrate 202 may be a mounting substrate, for example. A plurality of terminals 204 corresponding to the plurality of external connection terminals 106 of the package structure 100 are formed on one surface 202a of the substrate 202. In other words, the terminals 204 corresponding to the first external connection terminal 106a and the second external connection terminal 106b of the lead frame 110 are formed on the surface 202a of the substrate 202. The terminals 204 may include a terminal having a larger area corresponding to the first external connection terminal 106a and a terminal having a smaller area corresponding to the second external connection terminal 106b. In the present embodiment, the substrate 202 is provided with a terminal 206 corresponding to the island 112 of the package structure 100. On the terminals 204 and the terminal 206 of the substrate 202, a solder paste is applied by a screen printing method or the like, and the package structure 100 is mounted and aligned on the substrate 202 in such a manner that the surface 110b of the island 112 is opposed to the surface 202a of the substrate 202. Subsequently, the solder paste is molten by reflowing (heating), and the external connection terminals 106 of the package structure 100 and the terminals 204 of the substrate 202 as well as the island 112 of the package structure 100 and the terminal 206 of the substrate 202 are bonded via a solder 210 (FIG. 2B).

As described above, according to the semiconductor device 200 of the present embodiment, it is possible to attain good bonding by increasing the bonding area between the package structure 100 and the substrate 202 by bonding the island 112 in addition to the external connection terminals 106 to the substrate 202 via the solder 210. Also, in the semiconductor device 200, the area of the first external connection terminal 106a at the central part is large. As is found by the inventor, the heat stress is increased at the central part of each of the sides than at the corner part leading to the easy occurrence of cracks. However, it is possible to extend the solder bonding life in the present embodiment since the area of the first external connection terminal 106a at the central part is large.

Also, the above-described configuration is easily produced only by changing a pattern of the frame when producing the lead frame 110. Also, with such configuration, it is possible to reduce the area of the second external connection terminal 106b on which the heat stress is not applied, thereby attaining miniaturization of the package structure 100.

Figure 4:
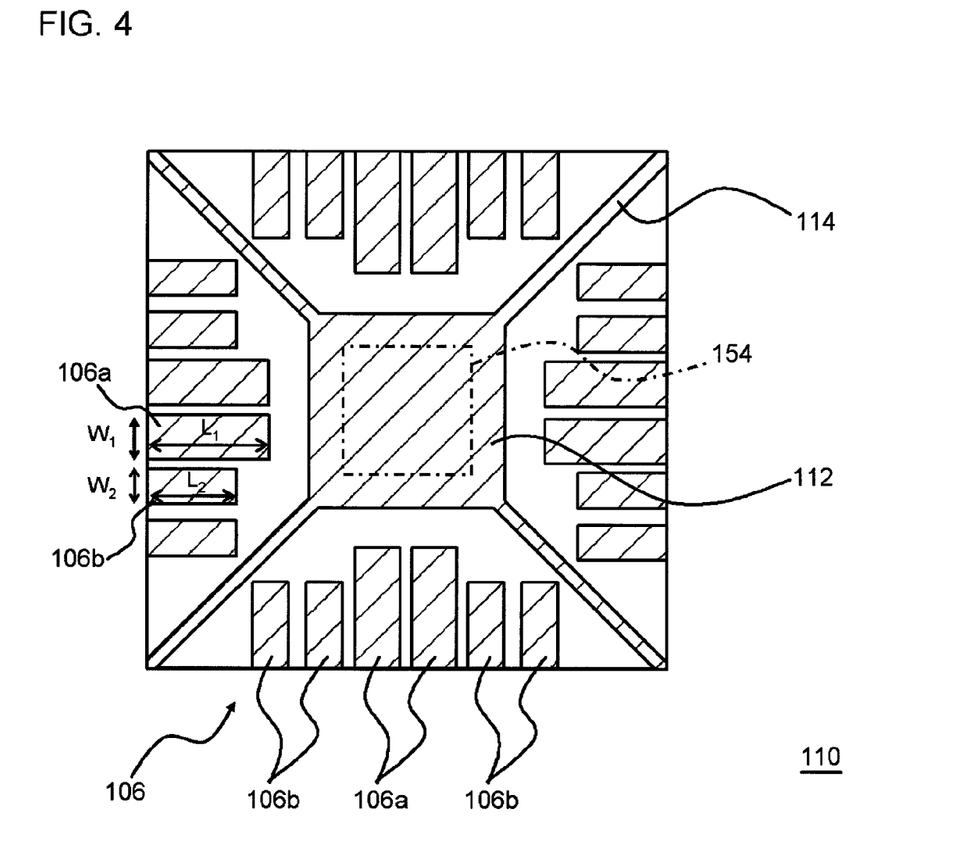
FIG. 4 is a plan view showing another example of a configuration of a part of a lead frame according to the embodiment of the present invention.

FIG. 4 is a plan view showing another example of the configuration of the lead frame according to the present embodiment.

The width $W_1$ of the first external connection terminal 106a and the width $W_2$ of the second external connection terminal 106b are equal to each other in FIG. 1, but the width $W_1$ is wider than the width $W_2$ in this example. In this case, too, the length $L_1$ of the first external connection terminal 106a is longer than the length $L_2$ of the second external connection terminal 106b. Therefore, the area $D_1$ of the first external connection terminal 106a is larger than the area $D_2$ of the second external connection terminal 106b.

With such configuration, it is possible to further increase the bonding area of the first external connection terminal 106a, thereby further improving the solder connection reliability.

Figure 5:
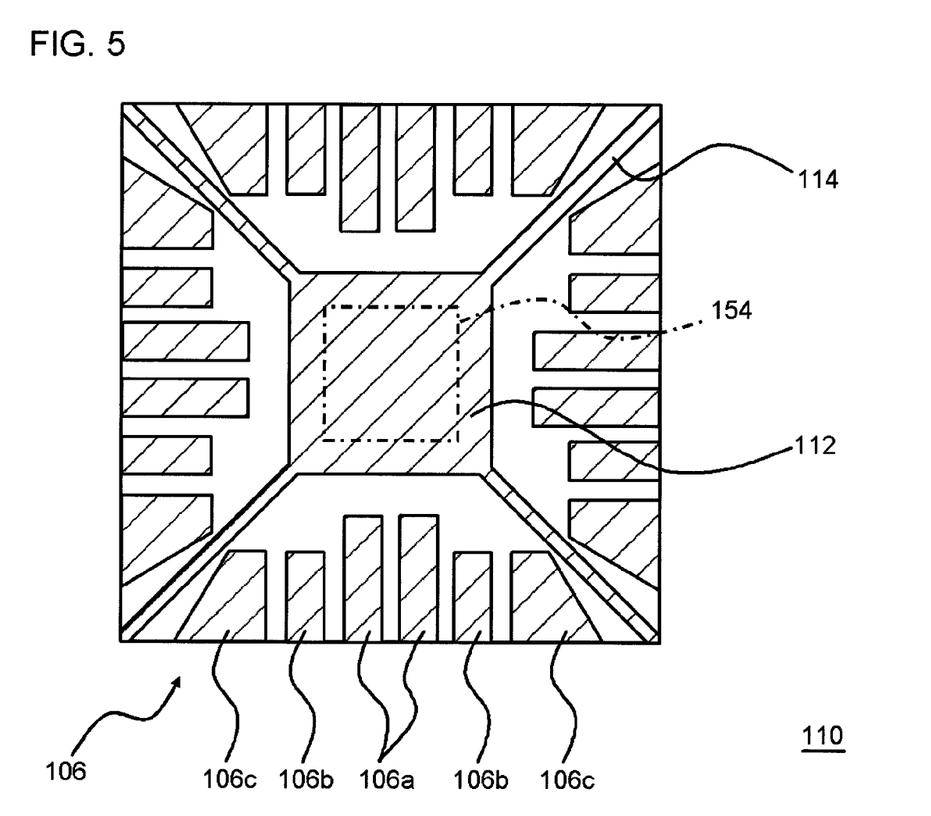
FIG. 5 is a plan view showing yet another example of a configuration of a part of a lead frame according to the embodiment of the present invention.

FIG. 5 is a plan view showing yet another example of the configuration of the lead frame according to the present embodiment. The configuration of the first external connection terminal 106a and the second external connection terminal 106b may be the same as that shown in FIG. 1.

As described in the foregoing, in the configuration of bonding the island 112 to the substrate 202 via the solder 210, the large heat stress is applied on the central part of each of the sides. In contrast, a mechanical stress due to impact such as falling is large at the corner part of the package structure 100. Therefore, a third external connection terminal 106c having a larger area $D_3$ than the area $D_2$ of the second external connection terminal 106b is disposed at the corner part. The third external connection terminal 106c is increased in area by, for example, widening a width to be larger than that of the second external connection terminal 106b. The area $D_1$ of the first external connection terminal 106a and the area $D_3$ of the third external connection terminal 106c may be equal to each other or either one of the areas may be larger than the other.

Figure 6:
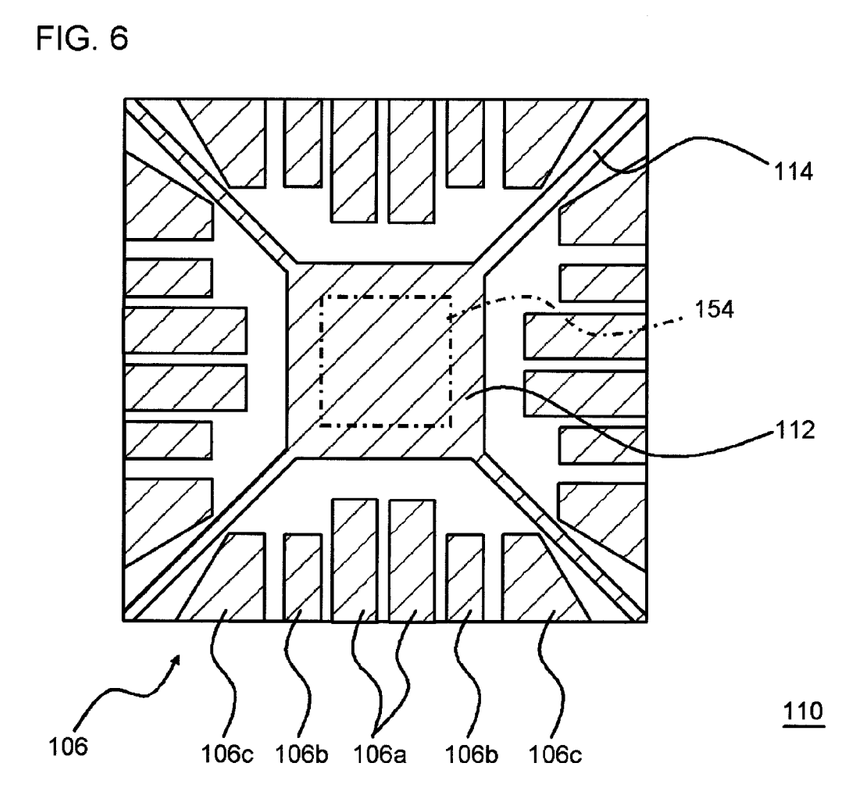
FIG. 6 is a plan view showing yet another example of a configuration of a part of a lead frame according to the embodiment of the present invention.

FIG. 6 is a plan view showing yet another example of the configuration of the lead frame according to the present embodiment.

The configuration of the first external connection terminal 106a and the second external connection terminal 106b may be the same as that shown in FIG. 4. Also, the third external connection terminal 106c having the area $D_3$ larger than the area $D_2$ of the second external connection terminal 106b is disposed at the corner part.

With the configurations shown in FIGS. 5 and 6, it is possible to improve the solder connecting reliability even in the case where the mechanical stress is applied. It may be possible to determine whether or not the third external connection terminal 106c is to be provided depending on a usage of the semiconductor device 200. For example, in the case where the semiconductor device 200 is introduced into an apparatus that is subject to impact due to falling and the like, such as a mobile terminal, the configuration in which the third external connection terminal 106c is provided may be selected.

Though the present embodiment is described with reference the accompanying drawings in the foregoing, the embodiment is not more than an example of the present invention, and it is possible to adapt various configurations other than those described above.

It is apparent that the present invention is not limited to the above embodiment, and may be modified and changed departing from the scope and spirit of the invention.

What is claimed is:

1. A semiconductor device comprising:
   a semiconductor chip;
   an island in which said semiconductor chip is mounted on one surface;
   a plurality of external connection terminals disposed around said semiconductor chip along an outer rim of said semiconductor chip with a gap being defined from said island; and
   a resin that seals said semiconductor chip, said island, and said plurality of external connection terminals from said one surface and exposes said island and said plurality of external connection terminals on other surface, wherein
   said plurality of external connection terminals include a first external connection terminal disposed at a central part of each of sides of the outer rim of said semiconductor chip and a second external connection terminal disposed at each of the sides of the outer rim of said semiconductor chip and outside said first external connection terminal, and said first external connection terminal has an area larger than that of said second external connection terminal, and
   said plurality of external connection terminals are disposed at corner parts of the sides of the outer rim of said semiconductor chip and further includes a third external connection terminal having an area that is larger than that of said second external connection terminal.

2. The semiconductor device according to claim 1, wherein each of said island and said plurality of connection terminals is bonded to a substrate via a solder on said other surface of said island.

3. The semiconductor device according to claim 1, wherein a leadless package in which said plurality of connection terminals are not projected from a lateral surface.

* * * * *